(12) United States Patent
Subramanian et al.

(10) Patent No.: US 9,991,886 B2
(45) Date of Patent: *Jun. 5, 2018

(54) METHOD AND APPARATUS FOR A BROWN OUT DETECTOR

(71) Applicant: Texas Instruments Incorporated, Dallas, TX (US)

(72) Inventors: Anand Subramanian, Bangalore (IN); Subramanian J. Narayan, Bangalore (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days. days.

This patent is subject to a terminal disclaimer.

(21) Appl. No.: 15/495,423

(22) Filed: Apr. 24, 2017

(65) Prior Publication Data

US 2017/0230045 A1    Aug. 10, 2017

Related U.S. Application Data

(63) Continuation of application No. 14/587,300, filed on Dec. 31, 2014, now Pat. No. 9,634,653.

(60) Provisional application No. 62/090,696, filed on Dec. 11, 2014.

(51) Int. Cl.
*H03K 5/22* (2006.01)
*H03K 5/153* (2006.01)
*H03K 17/22* (2006.01)
*H03K 5/19* (2006.01)

(52) U.S. Cl.
CPC ............. *H03K 17/223* (2013.01); *H03K 5/19* (2013.01)

(58) Field of Classification Search
CPC ........ G01R 19/16504; G01R 19/16519; G06F 1/26; G06F 1/24; H03K 17/22; H03K 17/223; H03L 7/00; H03L 7/10
USPC ..................................... 327/80–81, 141–143
See application file for complete search history.

(56) References Cited

U.S. PATENT DOCUMENTS 4,682,047 A   7/1987   von Sichart
8,692,593 B1  4/2014   Zhang et al.

OTHER PUBLICATIONS

Prosecution History from U.S. Appl. No. 14/587,300, dated Dec. 31, 2014 to Dec. 8, 2016, 95 pp.

*Primary Examiner* — Lincoln Donovan
*Assistant Examiner* — Diana J Cheng
(74) *Attorney, Agent, or Firm* — Gregory J. Albin; Charles A. Brill; Frank D. Cimino

(57) ABSTRACT

The disclosure provides a detector that includes a pre-charge circuit. The pre-charge circuit receives a supply voltage. A pre-charged comparator is coupled to the pre-charge circuit and receives the supply voltage. The pre-charged comparator generates a transition signal at a transition node. A slope of the transition signal is greater than a slope of the supply voltage. A first diode connected transistor receives the supply voltage. A first capacitor is coupled to the first diode connected transistor. An inverter is coupled to the first diode connected transistor and generates an enable signal when the supply voltage is below a threshold voltage.

17 Claims, 3 Drawing Sheets

METHOD AND APPARATUS FOR A BROWN OUT DETECTOR

CROSS REFERENCES TO RELATED APPLICATIONS

This application is a continuation of U.S. patent application Ser. No. 14/587,300, filed Dec. 31, 2014, which claims priority from U.S. Provisional Patent Application No. 62/090,696 filed on Dec. 11, 2014, both of which are hereby incorporated by reference in their entirety.

TECHNICAL FIELD

The present disclosure is generally related to low voltage detection circuits, and more particularly to a low power detector for detecting ultra-low brown out ramps.

BACKGROUND

Power on reset (POR) circuit is an integral part of a mixed signal device. With the continuous thrust for low power analog circuits, zero power PORs are widely used in mixed signal circuits. Zero power PORs are extremely popular in circuits targeted towards low power consumption. At power up, a digital state machine on an integrated circuit may be in an undefined state. It is important that logic of the digital state machine is in a known state during power up. POR circuits are used to reset the digital state machine at power up, to ensure that the digital state machine starts from a known state.

In addition, during the operation of the integrated circuit, if a power supply to the integrated circuit falls below a certain threshold, a reliable operation of the integrated circuit is jeopardized. This scenario is referred to as a brown out condition. A detector circuit is used to set the threshold and trigger the POR circuit to reset the integrated circuit. This detector circuit also needs to consume zero static power for a zero power solution. Most SoC (system on chip) either do not support the brown out condition with slower ramp rates. Other SoC's burn significant static power to support brown out condition.

SUMMARY

According to one aspect of the disclosure, a detector is provided. The detector includes a pre-charge circuit. The pre-charge circuit receives a supply voltage. A pre-charged comparator is coupled to the pre-charge circuit and receives the supply voltage. The pre-charged comparator generates a transition signal at a transition node. A slope of the transition signal is greater than a slope of the supply voltage. A first diode connected transistor receives the supply voltage. A first capacitor is coupled to the first diode connected transistor. An inverter is coupled to the first diode connected transistor and generates an enable signal when the supply voltage is below a threshold voltage.

BRIEF DESCRIPTION OF THE VIEWS OF DRAWINGS

DETAILED DESCRIPTION OF THE EMBODIMENTS

Figure 1:
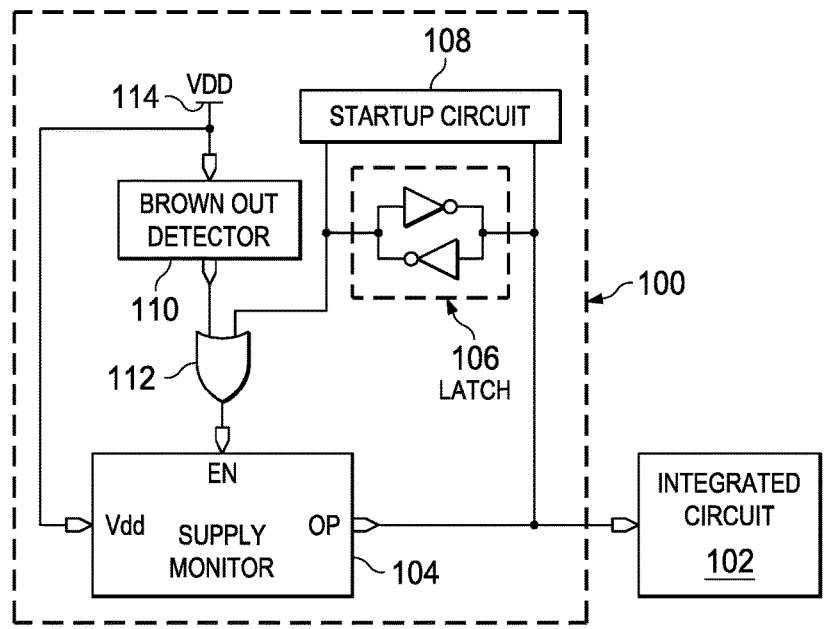
FIG. 1 illustrates a schematic of a power on reset (POR) circuit.

FIG. 1 illustrates a schematic of a power on reset (POR) circuit 100. The POR circuit 100 is coupled to the integrated circuit 102. The POR circuit 100 includes a supply monitor 104, a latch 106, a startup circuit 108, a brown out detector 110 and an OR gate 112. The brown out detector 110 receives a supply voltage VDD 114.

The latch 106 is coupled across the startup circuit 108. The OR gate 112 is coupled to the brown out detector 110 and the latch 106. The supply monitor 104 receives the supply voltage VDD 114 and an output of the OR gate 112. The integrated circuit 102 is coupled to the supply monitor 104.

The operation of the POR circuit 100 illustrated in FIG. 1 is explained now. The POR circuit 100 is utilized to detect the supply voltage VDD 114. The startup circuit 108 ensures that the POR circuit 100 is activated when the supply voltage VDD 114 is detected. When the supply voltage VDD 114 starts ramping, the startup circuit 108 provides a logic high (or logic '1') signal to the OR gate 112.

An output of the brown out detector 110 is set to logic low (or logic '0'). Thus, the output of the OR gate 112 is a logic high signal. The logic high signal from the OR gate 112 is received at an enable port EN of the supply monitor 104. The logic high signal activates the supply monitor 104.

When the supply voltage VDD 114 is greater than a threshold voltage, an output of the supply monitor 104 becomes logic high. A logic high signal is generated at an output port OP of the supply monitor 104. This logic high signal is a reset signal 116 generated by the POR circuit 100. The reset signal 116 is received by the integrated circuit 102. The reset signal 116 clears any digital logic which is stored on the integrated circuit 102. Thus, the reset signal 116 resets the integrated circuit 102.

The reset signal 116 is also received by the latch 106. Since, the reset signal 116 is a logic high signal, an output of the latch 106 transitions to logic low. The logic low signal from the latch 106 is provided to the OR gate 112. Since, the output of the brown out detector 110 is set to logic low, the output of the OR gate 112 is a logic low signal. The logic low signal deactivates the supply monitor 104.

As a result, any static power consumption in the POR circuit 100 is disabled. Thus, the POR circuit 100 transitions into zero power mode. However, the latch 106 maintains that the reset signal 116 is at logic high and the integrated circuit 102 is not affected when the POR circuit 100 transitions into zero power mode.

Since, the supply monitor 104 is deactivated, the POR circuit 100 is not able to monitor the supply voltage VDD 114. During a brown out condition, the supply voltage VDD 114 transition to a voltage less than the threshold voltage. When a brown out condition is detected, the brown out detector 110 is used to activate the supply monitor 104.

On detecting the brown out condition, the output of the brown out detector 110 transitions to logic high. The OR gate 112 receives a logic high signal from the brown out detector 110 and the logic low signal from the latch 106.

Thus, the output of the OR gate 112 is a logic high signal which activates the supply monitor 104. The supply monitor 104 tracks the supply voltage VDD 114. When the supply voltage VDD 114 is greater than the threshold voltage, the supply monitor 104 generates the reset signal 116 to reset the integrated circuit 102.

In general, during brown out condition the supply voltage VDD 114 transition to a voltage less than the threshold voltage and thereafter transitions to a voltage greater than the threshold voltage in a very short duration. In absence of brown out detector 110, the POR circuit 100 fails to detect the brown out condition. This corrupts the digital logic on integrated circuit 102, and therefore, the integrated circuit 102 loses its functionality.

For the POR circuit 100 to be a zero static power consumption POR, the brown out detector 110 is required to have zero static power. Therefore, an energy efficient brown out detector is required for POR circuit 100 to be in zero power mode.

Figure 2:
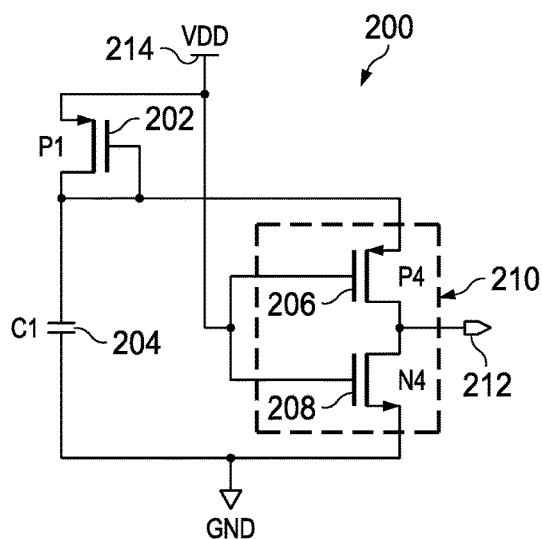
FIG. 2 illustrates a schematic of a brown out detector.

FIG. 2 illustrates a schematic of a brown out detector 200. The brown out detector 200 includes a first diode connected transistor P1 202, a first capacitor C1 204 and an inverter 210. The first diode connected transistor P1 202 includes a PMOS transistor whose gate terminal is coupled to a drain terminal. A source terminal of the PMOS transistor is coupled to a supply voltage VDD 214.

The inverter 210 includes a first PMOS transistor P4 206 and a first NMOS transistor N4 208. A gate terminal of each of the first PMOS transistor P4 206 and the first NMOS transistor N4 208 is coupled to the supply voltage VDD 214. A source terminal of the first PMOS transistor P4 206 is coupled to the first capacitor C1 204.

A source terminal of the first NMOS transistor N4 208 is coupled to a ground terminal GND. A drain terminal of the first PMOS transistor P4 206 is coupled to a drain terminal of the first NMOS transistor N4 208 to generate an enable signal 212. The enable signal 212 is similar to the signal generated by the brown out detector 110 and provided to the OR gate 112 (illustrated in FIG. 1).

One end of the first capacitor C1 204 is coupled to the first diode connected transistor P1 202 and to the first PMOS transistor P4 206. Other end of the first capacitor C1 204 is coupled to the ground terminal GND.

The operation of the brown out detector 200 illustrated in FIG. 2 is explained now. During normal operation, when the supply voltage VDD 214 is above a threshold voltage, the first capacitor C1 204 is charged to the supply voltage VDD through the first diode connected transistor P1 202. As long as the supply voltage VDD 214 is above the threshold voltage, the inverter 210 remains deactivated. Thus, the brown out detector 200 is in zero power mode.

During a brown out condition, the supply voltage VDD 214 transitions to a voltage less than the threshold voltage. When the supply voltage VDD 214 is less than the threshold voltage, the first diode connected transistor P1 202 gets reverse biased. Thus, the first capacitor C1 204 is isolated from the supply voltage VDD 214.

The first capacitor C1 204 acts as a pseudo supply to the inverter 210. When the supply voltage VDD 214 transitions below a threshold of the inverter 210, the enable signal 212 transitions to a logic high signal and thus, a brown out condition is detected. The operation of the brown out detector 200 is further explained in connection with FIG. 3.

Figure 3:
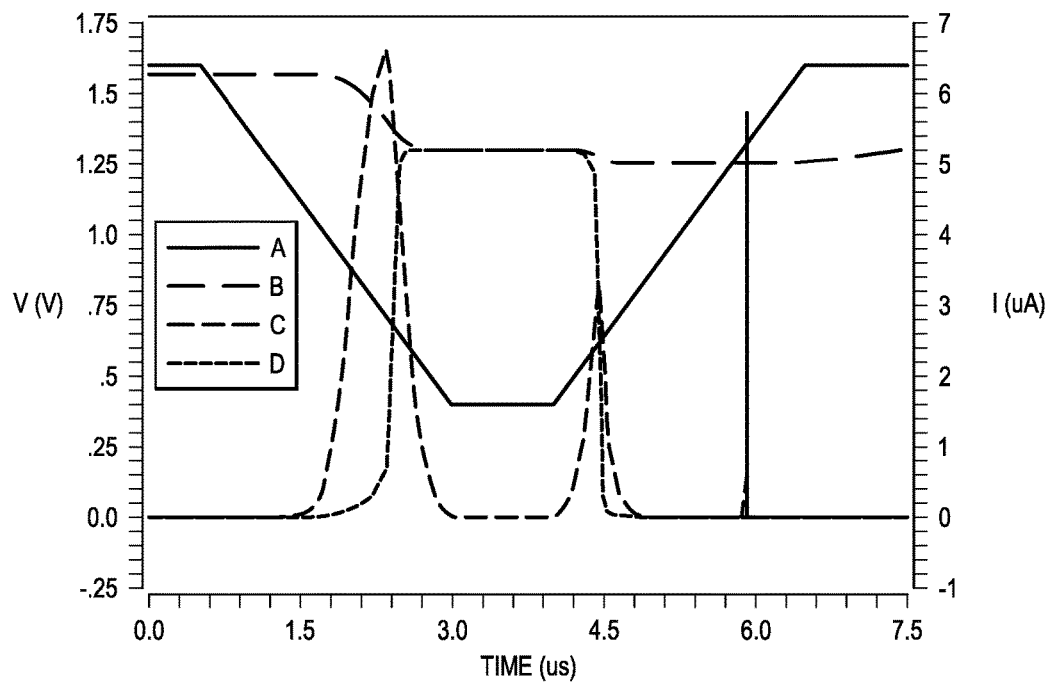
FIG. 3 illustrates a transient operation of the brown out detector illustrated in FIG. 2.

FIG. 3 illustrates a transient operation of the brown out detector 200. The figure is explained in connection with the brown out detector 200 illustrated in FIG. 2. A waveform 'A' illustrates the supply voltage VDD 214 and a waveform 'B' illustrates a voltage across the first capacitor C1 204. A waveform 'C' illustrates contention current through the inverter 210 and a waveform 'D' illustrates the enable signal 212.

When the supply voltage VDD 214 goes below the threshold voltage, as illustrated in waveform A, a state is reached when both the first PMOS transistor P4 206 and the first NMOS transistor N4 208 are in active region causing an increase in the contention current flowing through these transistors to the ground terminal GND. This is illustrated by waveform C.

This contention current results in loss of charge in the first capacitor C1 204. As a result, a voltage across the first capacitor C1 204 decreases which is illustrated in waveform B. As illustrated, when the supply voltage VDD 214 goes below the threshold voltage, a dip in the voltage across capacitor C1 204 is observed (waveform B).

For a given value of the first capacitor C1 204, the discharge of the first capacitor C1 204 limits the ramp time of a detectable brown out. Thus, to detect a brown out with a slower ramp, a large value of first capacitor C1 204 is required. Thus, the brown out detector 200 is limited by a value of the first capacitor C1 204 for brown out detection.

In most SoCs, the presence of off-chip capacitors tends to slow down the supply voltage VDD 214 ramp rate. This in turn necessitates that the brown out detector 200 supports slower ramp rates. The support for the slower ramp rate is critical for most of the mixed signal SoCs.

Due to presence of external de-capacitors on the supply voltage VDD 214, a brown out ramp time is of the order of milliseconds. In a SoC, for example, consuming 1 mA and having an external de-capacitor of 10 uF, the supply voltage VDD 214 ramp rate will be 1V in 10 milliseconds (1V/10 ms).

In order to detect such brown out ramp time, a value of the first capacitor C1 204 is of the order of nano farads. The high value of the capacitor is extremely large for any practical implementation particularly in small package applications. It is not feasible to place a capacitor of the order of nano farads.

The brown out detector 200 is not able to detect brown out ramp of the order of milliseconds. Thus, the brown out detector 200 cannot be used for brown out detection as the support for the slower ramp rate is critical for most of the mixed Signal SoCs.

Figure 4:
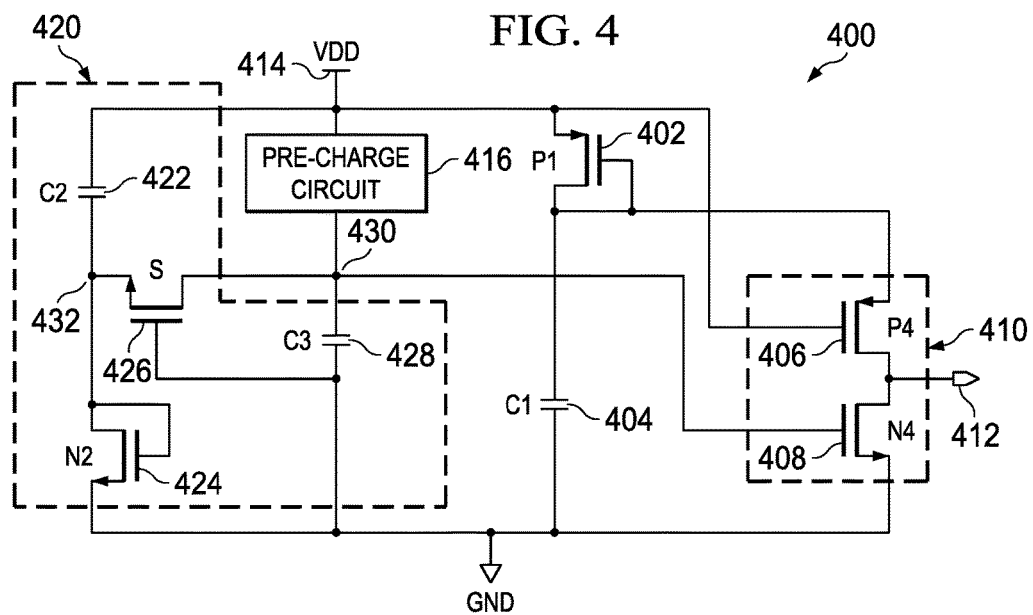
FIG. 4 illustrates a schematic of a detector, according to an embodiment

FIG. 4 illustrates a schematic of a detector 400, according to an embodiment. The detector 400, in one version, is analogous to the brown out detector 110 (illustrated in FIG. 1) in connection and operation. The detector 400 includes a first diode connected transistor P1 402, a first capacitor C1 404, an inverter 410, a pre-charge circuit 416 and a pre-charged comparator 420.

The first diode connected transistor P1 402 is a PMOS transistor whose gate terminal is coupled to a drain terminal. A source terminal of the PMOS transistor is coupled to a supply voltage VDD 414. A bulk terminal of the PMOS transistor is coupled to a drain terminal of the PMOS transistor. The inverter 410 is coupled to the first diode connected transistor P1 402. The inverter 410 includes a first PMOS transistor P4 406 and a first NMOS transistor N4 408. A gate terminal of the first PMOS transistor P4 406 is coupled to the supply voltage VDD 414. A source terminal of the first PMOS transistor P4 406 is coupled to the first capacitor C1 404.

A gate terminal of the first NMOS transistor N4 408 is coupled to a transition node 430. A source terminal of the first NMOS transistor N4 408 is coupled to a ground terminal GND. A drain terminal of the first PMOS transistor P4 406 is coupled to a drain terminal of the first NMOS transistor N4 408 to generate an enable signal 412. The enable signal 412 is similar to the signal generated by the brown out detector 110 and provided to the OR gate 112 (illustrated in FIG. 1).

One end of the first capacitor C1 404 is coupled to the first diode connected transistor P1 402 and to the first PMOS transistor P4 406. Other end of the first capacitor C1 404 is coupled to the ground terminal GND. The pre-charge circuit 416 receives the supply voltage VDD 414. In one example, the pre-charge circuit 416 is a mono-shot trigger circuit. In another example, the pre-charge circuit 416 is a weak pull-up circuit for example, but not limited to, a high impedance resistor and a diode.

The pre-charged comparator 420 is coupled to the pre-charge circuit 416. The pre-charged comparator 420 also receives the supply voltage VDD 414. The pre-charged comparator 420 includes a second capacitor C2 422, a second diode connected transistor N2 424, a third capacitor C3 428 and a switch S 426.

The second capacitor C2 422 receives the supply voltage VDD 414. The second diode connected transistor N2 424 is coupled to the second capacitor C2 422 at a node 432. The third capacitor C3 428 is coupled to the pre-charge circuit 416 at the transition node 430. A switch S 426 is coupled between the second capacitor C2 422 and the transition node 430.

The second diode connected transistor N2 424 includes an NMOS transistor whose gate terminal is coupled to a drain terminal. A source terminal of the second diode connected transistor N2 424 is coupled to the ground terminal GND. A bulk terminal of the second diode connected transistor N2 424 is coupled to the drain terminal. The switch S 426 is an NMOS transistor whose gate terminal is coupled to the ground terminal GND, and whose drain terminal is coupled to the transition node 430. A source terminal of the NMOS transistor in the switch S 426 is coupled to the second capacitor C2 422. In one version, the switch S 426 is at least one of the following, but not limited to, a PMOS transistor and a CMOS switch.

One end of the second capacitor C2 422 receives the supply voltage VDD 414 and the other end of the second capacitor C2 422 is coupled to the second diode connected transistor N2 424. One end of the third capacitor C3 428 is coupled to the pre-charge circuit 416 at the transition node 430, and other end of the third capacitor C3 428 is coupled to the ground terminal GND. The detector 400 may include one or more additional components known to those skilled in the relevant art and are not discussed here for simplicity of the description.

The operation of the detector 400 illustrated in FIG. 4 is explained now. During normal operation when the supply voltage VDD 414 is above a threshold voltage, the first capacitor C1 404 is charged to the supply voltage VDD through the first diode connected transistor P1 402. The ground terminal GND offers a ground potential.

A bottom plate of the second capacitor C2 422 is at the ground potential and a top plate of the second capacitor C2 422 is charged to the supply voltage VDD. A bottom plate of the third capacitor C3 428 is at the ground potential and a top plate of the third capacitor C3 428 is charged to the supply voltage VDD through the pre-charge circuit 416. A capacitance of the second capacitor C2 422 is greater than a capacitance of the third capacitor C3 428. During normal operation, the switch S 426 is deactivated.

During a brown out condition, the supply voltage VDD 414 transition to a voltage less than the threshold voltage. When the supply voltage VDD 414 starts to decrease, the second diode connected transistor N2 424 is reverse biased. A voltage at the node 432 will be less than the ground potential. The node 432 tracks the supply voltage VDD 414 with an offset.

When a voltage at the node 432 is less than a threshold voltage of the NMOS transistor in the switch S 426, the switch S 426 is activated. When the switch S 426 is activated, the third capacitor C3 428 is discharged through the second capacitor C2 422. In one example, the capacitance of the second capacitor C2 422 is significantly greater than the capacitance of the third capacitor C3 428. Therefore, the third capacitor C3 428 is completely discharged through the second capacitor C2 422.

A voltage at the transition node 430 transition from the supply voltage VDD to a voltage at the node 432. Thus, the pre-charged comparator 420 generates a transition signal at the transition node 430 which deactivates the first NMOS transistor N4 408. In one example, a slope of the transition signal is greater than a slope of the supply voltage VDD. In another example, the first NMOS transistor N4 408 is deactivated when a voltage at the transition node 430 is below a threshold of the first NMOS transistor N4 408.

When the supply voltage VDD 414 is below a threshold of the first PMOS transistor P4 406, the enable signal 412 transition to a logic high signal and thus, a brown out condition is detected. Since during detection of brown out condition, the first PMOS transistor P4 406 is activated and the first NMOS transistor N4 408 is deactivated, the contention current flowing through the inverter 410 is far lesser than the contention current flowing in the brown out detector 200.

In one version, 0 contention current flows through the inverter 410. Also, the first capacitor C1 404 holds its charge since there is not loss of charge because of the contention current. When the supply voltage VDD 414 resumes its original level, the pre-charge circuit 416 charges the top plate of the third capacitor C3 428 to supply voltage VDD.

Since the contention current through the inverter 410 is very minimal in the detector 400, a maximum brown out ramp time that can be detected by the detector 400 is limited by a reverse leakage of the second diode connected transistor N2 424 and by a reverse leakage of the first diode connected transistor P1 402.

In one version, the second capacitor C2 422 and the first capacitor C1 404 are selected such that a brown out ramp rate is greater than a rate at which reverse leakage in the N2 424 and P1 402 discharges C2 422 and C1 404 respectively. The reverse leakage of the second diode connected transistor N2 424 and of the first diode connected transistor P1 402 are process and temperature dependent. In another version, when a maximum reverse leakage current in the detector 400 is I, C is a capacitance of the first capacitor C1 404 and the second capacitor C2 422 and K is the required brown out ramp time, then I/C is less than K.

For a given value of the first capacitor C1 404 and the second capacitor C2 422, a brown out ramp time that can be detected by the detector 400 is greater than that can be detected by the brown out detector 200. The operation of the detector 400 is further explained in connection with FIG. 5.

Figure 5:
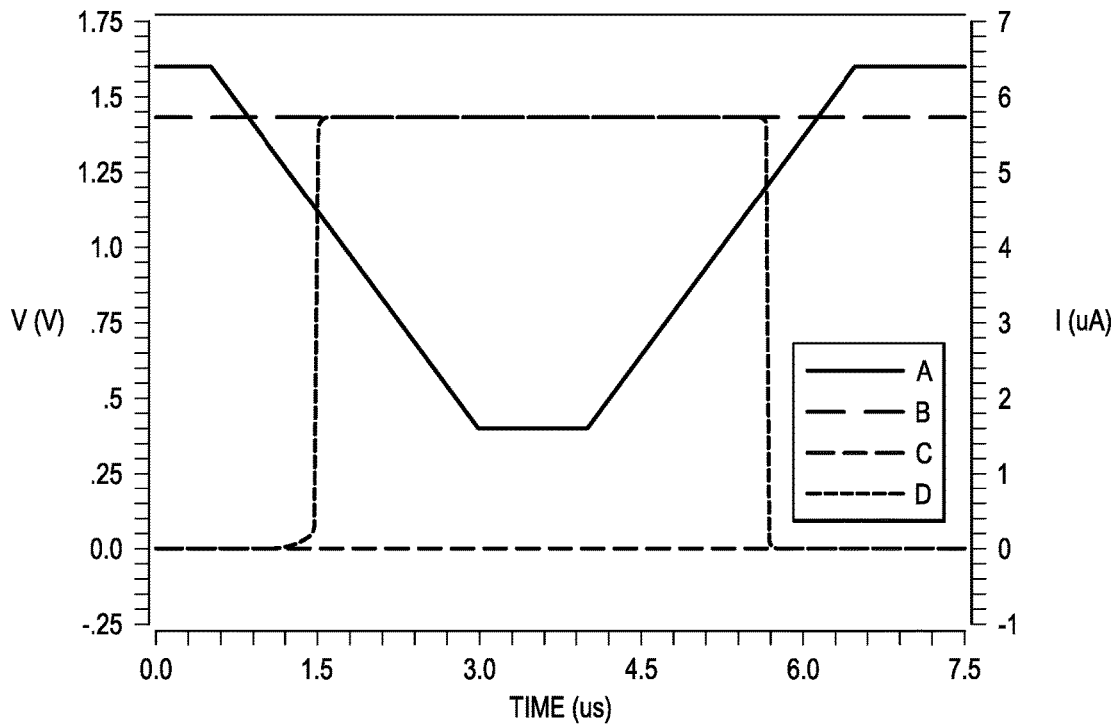
FIG. 5 illustrate a transient operation of the detector illustrated in FIG. 4, according to an embodiment.

FIG. 5 illustrates a transient operation of the detector 400, according to an embodiment. The figure is explained in connection with the detector 400, illustrated in FIG. 4. A waveform 'A' illustrates the supply voltage VDD 414 and a waveform 'B' illustrates a voltage across the first capacitor C1 404. A waveform 'C' illustrates contention current through the inverter 410 and a waveform 'D' illustrates the enable signal 412.

When the supply voltage VDD 414 goes below the threshold voltage, as illustrated in waveform A, the first NMOS transistor N4 408 is deactivated. Thus, the contention current, as illustrated by waveform C, is negligible. When the supply voltage VDD 414 is below a threshold of the first PMOS transistor P4 406, the first PMOS transistor P4 406 is activated. Thus the enable signal 412 transitions to a logic high signal, as illustrated by waveform D.

Also, the first capacitor C1 404 holds its charge since there is no loss of charge because of the contention current. This is illustrated in waveform B. Since the contention current in the inverter 410 is almost negligible and the voltage across the first capacitor C1 404 is minimally discharged, the detector 400 is able to detect brown out ramp times of the order of milliseconds for the same value of on-chip capacitor as compared to brown out detector 200.

In one example, a total capacitance the first capacitor C1 404 and the third capacitor C3 428 in the detector 400 is of the order of pico-farads and a capacitance of the second capacitor C2 422 is of the order of hundreds of femto-farads. A maximum brown out ramp time that can be detected by the detector 400 is limited by a reverse leakage of the second diode connected transistor N2 424 and by a reverse leakage of the first diode connected transistor P1 402.

In addition, for a given brown out ramp time, the detector 400 requires much lower on-chip capacitance as compared to brown out detector 200. This is particularly advantageous in low package sizes where die area becomes a premium. The detector 400 also finds application in tracking low power profiles in integrated circuit. The detector 400 provides a zero power solution.

In one version, the transition signal generated by the pre-charged comparator 420 is used to control both the first PMOS transistor P4 406 and the first NMOS transistor N4 408. In another version, the transition signal generated by the pre-charged comparator 420 is used to control the first NMOS transistor N4 408 and a delayed version of the transition signal is used to control the first PMOS transistor P4 406. A delay element is used to generate a delayed version of the transition signal.

Figure 6:
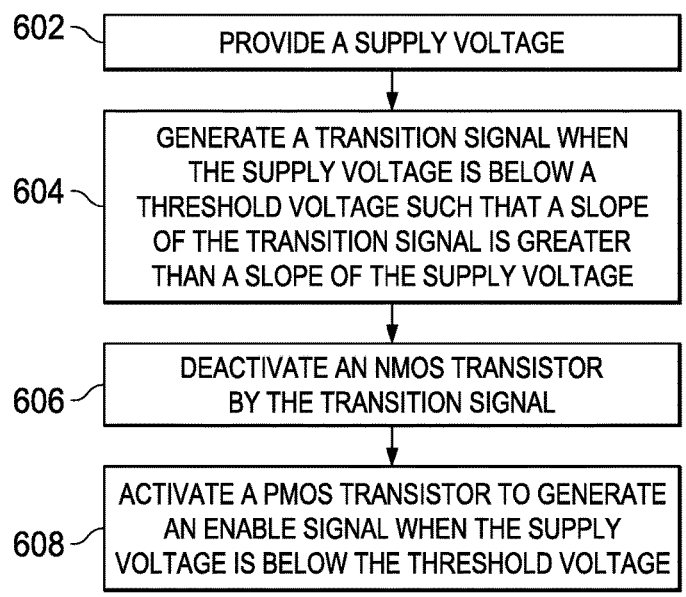
FIG. 6 is a flowchart illustrating a method, according to an embodiment.

FIG. 6 is a flowchart 600 illustrating a method, according to an embodiment. At step 602, a supply voltage is provided. The supply voltage, in an example, is provided to an integrated circuit. At step 604, a transition signal is generated when the supply voltage is below a threshold voltage. A slope of the transition signal is greater than a slope of the supply voltage.

An NMOS transistor is deactivated by the transition signal, at step 606. For example, in detector 400, a transition signal generated at the transition node 430 has a slope greater than a slope of the supply voltage VDD 414. A voltage level of the transition signal is below a threshold voltage of the first NMOS transistor N4 408. This results in quick deactivation of the first NMOS transistor N4 408 thus minimizing the contention current flowing through the inverter 410.

At step 608, a PMOS transistor is activated to generate an enable signal when the supply voltage is below the threshold voltage. In detector 400, the first PMOS transistor P4 406 is activated when the supply voltage is below the threshold voltage. The enable signal 412 transition to a logic high signal and thus, a brown out condition is detected.

The detector 400 provided a scheme in which activation of the first NMOS transistor N4 408 and the first PMOS transistor P4 406 is performed separately. The first NMOS transistor N4 408 is controlled by the transition signal and the first PMOS transistor P4 406 is controlled by the supply voltage VDD 414. Thus, the first NMOS transistor N4 408 and the first PMOS transistor P4 406 are not active simultaneously which minimizes the contention current flowing through the inverter 410.

Figure 7:
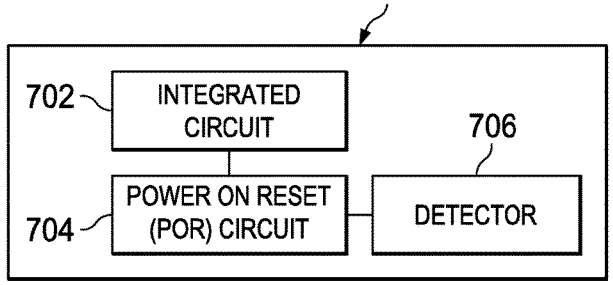
FIG. 7 illustrates a device, according to an embodiment.

FIG. 7 illustrates a device 700, according to an embodiment. The device 700 is, or is incorporated into, a mobile communication device, such as a mobile phone, a personal digital assistant, a transceiver, a personal computer, or any other type of electronic system. The device 700 may include one or more additional components known to those skilled in the relevant art and are not discussed here for simplicity of the description.

The device 700 includes an integrated circuit 702. The integrated circuit 702 includes one of the following, but not limited to, a computing device, a processing unit, a memory module, and a tester. The processing unit can be, for example, a CISC-type (Complex Instruction Set Computer) CPU, RISC-type CPU (Reduced Instruction Set Computer), or a digital signal processor (DSP). The memory module can be memory such as RAM, flash memory, or disk storage.

The device 700 includes a power on reset (POR) circuit 704 and a detector 706. In one example, the integrated circuit, the POR circuit 704 and the detector 706 are embedded (or integrated) on a same chip. The POR circuit 704 is coupled to the integrated circuit 702. The POR circuit 704, in an example, is similar to the POR circuit 100 in connection and operation. The POR circuit 704 provides a reset signal to the integrated circuit 702. The reset signal clears any digital logic which is stored on the integrated circuit 702. Thus, the reset signal resets the integrated circuit 702.

The detector 706 is coupled to the POR circuit 704. In one version, the POR circuit 704 is integrated with the detector 706. The detector 706 is analogous to the detector 400 in connection and operation. For a given brown out ramp time, the detector 706 requires much lower on-chip capacitance as compared to brown out detector 200. This is particularly advantageous in low package sizes where die area becomes a premium.

The detector 706 also finds application in tracking low power profiles in integrated circuit. The detector 706 provides a zero power solution as no or very less contention current flows through the detector 706. The detector 706 is able to detect brown out ramp times of the order of milliseconds for the same value of on-chip capacitor as compared to brown out detector 200.

The term "high" is generally intended to describe a signal that is at logic "1," and the term "low" is generally intended to describe a signal that is at logic "0." The term "on" applied to a transistor or group of transistors is generally intended to describe gate biasing to enable current flow through the transistor or transistors. Also, the terms "deactivation" or "deactivated" or turn "OFF" or turned "OFF" is used to describe a deactivation of a device, a component or a signal. The terms "activation" or "activated" or turned "ON" describes activation of a device, a component or a signal.

The foregoing description sets forth numerous specific details to convey a thorough understanding of the invention. However, it will be apparent to one skilled in the art that the invention may be practiced without these specific details. Well-known features are sometimes not described in detail in order to avoid obscuring the invention. Other variations and embodiments are possible in light of above teachings, and it is thus intended that the scope of invention not be limited by this Detailed Description, but only by the following Claims.

What is claimed is:

1. A detector comprising:
a pre-charge circuit configured to receive a supply voltage;
a pre-charged comparator coupled to the pre-charge circuit and configured to receive the supply voltage and configured to generate a transition signal at a transition node, wherein a slope of the transition signal is greater than a slope of the supply voltage;
a first diode connected transistor configured to receive the supply voltage;
a first capacitor coupled to the first diode connected transistor; and
an inverter coupled to the first diode connected transistor and configured to generate an enable signal when the supply voltage is below a threshold voltage, wherein the pre-charged comparator comprises:
a second capacitor configured to receive the supply voltage;
a second diode connected transistor coupled to the second capacitor;
a third capacitor coupled to the pre-charge circuit at the transition node; and
a switch coupled between the second capacitor and the transition node.

2. The detector of claim 1, wherein the second diode connected transistor, the third capacitor and the switch are coupled to a ground terminal.

3. The detector of claim 1, wherein a capacitance of the second capacitor is greater than a capacitance of the third capacitor.

4. The detector of claim 1, wherein the first diode connected transistor is a PMOS transistor whose gate terminal is coupled to a drain terminal.

5. The detector of claim 1, wherein the second capacitor is charged to the supply voltage, and the third capacitor is charged to the supply voltage through the pre-charge circuit.

6. The detector of claim 1, wherein when the supply voltage is below the threshold voltage, the second diode connected transistor is reverse biased and the switch is activated.

7. The detector of claim 6, wherein when the switch is activated, the third capacitor is discharged through the second capacitor such that the transition signal deactivates the first NMOS transistor.

8. A detector comprising:
a pre-charge circuit configured to receive a supply voltage;
a pre-charged comparator coupled to the pre-charge circuit and configured to receive the supply voltage and configured to generate a transition signal at a transition node, wherein a slope of the transition signal is greater than a slope of the supply voltage;
a first diode connected transistor configured to receive the supply voltage;
a first capacitor coupled to the first diode connected transistor; and
an inverter coupled to the first diode connected transistor and configured to generate an enable signal when the supply voltage is below a threshold voltage, wherein the inverter comprises:
a first PMOS transistor whose gate terminal is configured to receive the supply voltage and whose source terminal is coupled to the first capacitor; and
a first NMOS transistor whose gate terminal is coupled to the transition node and whose source terminal is coupled to the ground terminal, wherein a drain terminal of the first PMOS transistor is coupled to a drain terminal of the first NMOS transistor to generate the enable signal.

9. A detector comprising:
a pre-charge circuit configured to receive a supply voltage;
a pre-charged comparator coupled to the pre-charge circuit and configured to receive the supply voltage and configured to generate a transition signal at a transition node, wherein a slope of the transition signal is greater than a slope of the supply voltage;
a first diode connected transistor configured to receive the supply voltage;
a first capacitor coupled to the first diode connected transistor; and
an inverter coupled to the first diode connected transistor and configured to generate an enable signal when the supply voltage is below a threshold voltage,
wherein the pre-charge circuit is at least one of a monoshot trigger circuit and a weak pull-up circuit.

10. A method comprising:
providing a supply voltage;
charging a first capacitor, a second capacitor and a third capacitor to the supply voltage;
generating a transition signal when the supply voltage is below a threshold voltage, wherein a slope of the transition signal is greater than a slope of the supply voltage;
deactivating a first NMOS transistor by the transition signal; and
activating a first PMOS transistor to generate an enable signal when the supply voltage is below the threshold voltage.

11. The method of claim 10 further comprising activating the first PMOS transistor by the first capacitor when the supply voltage is below the threshold voltage.

12. A method comprising:
providing a supply voltage;
generating a transition signal when the supply voltage is below a threshold voltage, wherein a slope of the transition signal is greater than a slope of the supply voltage;
deactivating a first NMOS transistor by the transition signal;
activating a first PMOS transistor to generate an enable signal when the supply voltage is below the threshold voltage; and
reverse biasing a diode connected transistor and activating a switch, when the supply voltage is below the threshold voltage.

13. The method of claim 12 further comprising:
charging a first capacitor, a second capacitor and a third capacitor to the supply voltage; and
discharging the third capacitor through the second capacitor to generate the transition signal when the switch is activated.

14. A device comprising:
an integrated circuit;
a power on reset (POR) circuit coupled to the integrated circuit;
a detector coupled to the POR circuit, the detector comprising:
a pre-charge circuit configured to receive a supply voltage;

a pre-charged comparator coupled to the pre-charge circuit and configured to receive the supply voltage and configured to generate a transition signal at a transition node, wherein a slope of the transition signal is greater than a slope of the supply voltage;

a first diode connected transistor configured to receive the supply voltage;

a first capacitor coupled to the first diode connected transistor; and an inverter coupled to the first diode connected transistor and configured to generate an enable signal when the supply voltage is below a threshold voltage, wherein the pre-charged comparator comprises:

a second capacitor configured to receive the supply voltage;

a second diode connected transistor coupled to the second capacitor;

a third capacitor coupled to the pre-charge circuit at the transition node; and a switch coupled between the second capacitor and the transition node.

15. The device of claim 14, wherein the second capacitor is charged to the supply voltage, and the third capacitor is charged to the supply voltage through the pre-charge circuit.

16. The device of claim 14, wherein:

when the supply voltage is below the threshold voltage, the second diode connected transistor is reverse biased and the switch is activated; and when the switch is activated, the third capacitor is discharged through the second capacitor such that the transition signal deactivates the first NMOS transistor.

17. A device comprising:

an integrated circuit;

a power on reset (POR) circuit coupled to the integrated circuit;

a detector coupled to the POR circuit, the detector comprising:

a pre-charge circuit configured to receive a supply voltage;

a pre-charged comparator coupled to the pre-charge circuit and configured to receive the supply voltage and configured to generate a transition signal at a transition node, wherein a slope of the transition signal is greater than a slope of the supply voltage;

a first diode connected transistor configured to receive the supply voltage;

a first capacitor coupled to the first diode connected transistor; and an inverter coupled to the first diode connected transistor and configured to generate an enable signal when the supply voltage is below a threshold voltage, wherein the inverter comprises:

a first PMOS transistor whose gate terminal is configured to receive the supply voltage and whose source terminal is coupled to the first capacitor; and a first NMOS transistor whose gate terminal is coupled to the transition node and whose source terminal is coupled to a ground terminal, wherein a drain terminal of the first PMOS transistor is coupled to a drain terminal of the first NMOS transistor to generate the enable signal.

* * * * *